United States Patent
Shapiro et al.

(10) Patent No.: US 12,081,210 B2
(45) Date of Patent: *Sep. 3, 2024

(54) BODY RESISTOR BYPASS FOR RF FET SWITCH STACK

(71) Applicant: pSemi Corporation, San Diego, CA (US)

(72) Inventors: Eric S. Shapiro, San Diego, CA (US); Ravindranath D. Shrivastava, San Diego, CA (US); Fleming Lam, San Diego, CA (US); Matt Allison, Oceanside, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/473,742

(22) Filed: Sep. 25, 2023

(65) Prior Publication Data

US 2024/0063789 A1 Feb. 22, 2024

Related U.S. Application Data

(63) Continuation of application No. PCT/US2022/029042, filed on May 12, 2022, which is a continuation of application No. 17/321,363, filed on May 14, 2021, now Pat. No. 11,405,034.

(51) Int. Cl.
*H03K 17/687* (2006.01)
(52) U.S. Cl.
CPC .............................. *H03K 17/6871* (2013.01)

(58) Field of Classification Search
CPC .................... H03K 17/6871; H03K 17/693
See application file for complete search history.

(56) References Cited

U.S. PATENT DOCUMENTS

| | | |
|---|---|---|
| 5,274,276 A | 12/1993 | Casper et al. |
| 7,910,993 B2 | 3/2011 | Brindle et al. |
| 9,143,124 B2 | 9/2015 | Cam et al. |
| 9,184,731 B2 | 11/2015 | Lam |
| 9,893,722 B2 | 2/2018 | Mokalla |
| 9,941,347 B2 | 4/2018 | Shapiro et al. |

(Continued)

FOREIGN PATENT DOCUMENTS

| | | |
|---|---|---|
| EP | 3484049 A1 | 5/2019 |
| KR | 100970374 B1 | 7/2010 |

(Continued)

OTHER PUBLICATIONS

Corrected Notice of Allowability issued by the USPTO for U.S. Appl. No. 17/492,180, filed Oct. 1, 2021. Mailing date Feb. 10, 2023. 3 pages.

(Continued)

*Primary Examiner* — Metasebia T Retebo
(74) *Attorney, Agent, or Firm* — Steinfl + Bruno LLP

(57) ABSTRACT

A FET switch stack and a method to operate a FET switch stack. The FET switch stack includes a stacked arrangement of body bypass FET switches connected across respective common body resistors. The body bypass FET switches bypass the respective common body resistors during the OFF steady state of the FET switch stack and do not bypass the respective common body resistors during the ON steady state.

16 Claims, 5 Drawing Sheets

(56) References Cited

U.S. PATENT DOCUMENTS

| | | | |
|---|---|---|---|
| 10,236,872 | B1 | 3/2019 | Willard et al. |
| 10,396,772 | B2 | 8/2019 | Shanjani et al. |
| 10,454,529 | B2 | 10/2019 | Kerr |
| 10,461,729 | B2 | 10/2019 | Kerr et al. |
| 10,608,623 | B2 | 3/2020 | Kerr et al. |
| 10,763,842 | B1 | 9/2020 | Dai |
| 10,897,246 | B2 | 1/2021 | Scott et al. |
| 11,290,001 | B2 | 3/2022 | Zhang et al. |
| 11,405,031 | B1 | 8/2022 | Shrivastava et al. |
| 11,405,034 | B1 * | 8/2022 | Shapiro ............... H03K 17/693 |
| 11,405,035 | B1 | 8/2022 | Genc et al. |
| 11,632,107 | B1 | 4/2023 | Shrivastava et al. |
| 11,671,135 | B2 | 6/2023 | Shrivastava et al. |
| 2010/0013541 | A1 | 1/2010 | Balboni |
| 2010/0176783 | A1 | 7/2010 | Tagome |
| 2016/0329891 | A1 | 11/2016 | Bakalski et al. |
| 2017/0302259 | A1 | 10/2017 | Mokalla |
| 2018/0175851 | A1 | 6/2018 | Kerr et al. |
| 2019/0305768 | A1 | 10/2019 | Willard et al. |
| 2020/0244226 | A1 | 7/2020 | Klaren et al. |
| 2020/0266778 | A1 | 8/2020 | Ayranci et al. |
| 2021/0075420 | A1 | 3/2021 | Kovac et al. |
| 2021/0167773 | A1 | 6/2021 | Burgener et al. |
| 2023/0105033 | A1 | 4/2023 | Shrivastava et al. |
| 2023/0107974 | A1 | 4/2023 | Shrivastava et al. |
| 2023/0283277 | A1 | 9/2023 | Shrivastava et al. |

FOREIGN PATENT DOCUMENTS

| | | | |
|---|---|---|---|
| KR | 20160131926 | A | 11/2016 |
| WO | 2013/017696 | A1 | 2/2013 |
| WO | 2022/241147 | A1 | 11/2022 |
| WO | 2023/287560 | A1 | 1/2023 |
| WO | 2023/022792 | A1 | 2/2023 |
| WO | 2023/056242 | | 4/2023 |
| WO | 2023/056244 | A1 | 4/2023 |

OTHER PUBLICATIONS

International Search Report and Written Opinion for International application No. PCT/US2022/034581 filed on Jun. 22, 2022. Mailed on Oct. 11, 2022. 16 pages.

International Search Report and Written Opinion for International application No. PCT/US2022/077067 filed on Sep. 27, 2022. Mailed on Jan. 26, 2023. 9 pages.

International Search Report and Written Opinion for International PCT Application No. PCT/US2022/034580 filed on Jun. 22, 2022, on behalf of pSemi Corporation, Mail Date: Jan. 19, 2023, 10 pages.

International Search Report and Written Opinion for International PCT Application No. PCT/US2022/077069 filed on Sep. 27, 2022, on behalf of pSemi Corporation, Mailed on Jan. 20, 2023, 11 Pages.

International Search Report and Written Opinion for PCT/US2022/029042 filed on May 12, 2022 on behalf of pSemi Corporation Mail Date: Sep. 6, 2022 11 pages.

Non-Final Office Action for U.S. Appl. No. 17/374,927, filed Jul. 13, 2021 on behalf of pSemi Corporation Mail Date: Apr. 14, 2022 9 pages.

Non-Final Office Action for U.S. Appl. No. 17/492,180, filed Oct. 1, 2021 on behalf of pSemi Corporation, Mail Date: Aug. 2, 2022, 18 pages.

Notice of Allowance for U.S. Appl. No. 17/492,199, filed Oct. 1, 2021, on behalf of pSemi Corporation, Mailed Date: Feb. 9, 2023, 12 pages.

Notice of Allowance for U.S. Appl. No. 17/403,758, filed Aug. 16, 2021, on behalf of pSemi Corporation. Mail Date: May 25, 2022. 9 Pages.

Notice of Allowance for U.S. Appl. No. 17/492,180, filed Oct. 1, 2021, on behalf of pSemi Corporation. Mail Date: Dec. 19, 2022. 7 Pages.

Notice of Allowance U.S. Appl. No. 17/374,927, filed Jul. 13, 2021, on behalf of pSemi Corporation. Mail Date: May 11, 2022. 8 Pages.

Supplemental Notice of Allowance for U.S. Appl. No. 17/492,199, filed Oct. 1, 2021, on behalf of pSemi Corporation, Mailed Date: Feb. 28, 2023, 3 pages.

* cited by examiner

BODY RESISTOR BYPASS FOR RF FET SWITCH STACK

CROSS-REFERENCE TO RELATED APPLICATIONS

The present application is a continuation of International Patent Application No. PCT/US2022/029042, filed May 12, 2022, which in turn is a continuation of U.S. patent application Ser. No. 17/321,363, filed May 14, 2021, all of which are herein incorporated by reference in their entirety.

FIELD

The present disclosure relates to radio-frequency (RF) switches, such as series or shunt RF stacked switches. More in particular, it relates to a body resistor bypass for an RF switch stack.

BACKGROUND

A series RF switch comprising a stack of FETs designed to achieve high compression point e.g. about 50 dBm in the case of antenna tuning switches or high power RF switches for communication systems, encounters challenges with regards to insertion loss in the ON-state of the switch and acceptable Roff in the OFF-state of the switch.

A first challenge is due to the overall die surface area of the stack of FETs being large. As a consequence, resistive and/or capacitive paths from the FETs to the substrate reduce the impedance to ground in both ON and OFF states.

In addition, the stacked FET switch includes body and gate bias resistor networks. The body bias network's need to manage transistor body current under high power conditions and meet switching time specifications forces boundaries on the architecture of such network and limits resistor values. Average body current output from an OFF transistor occurs when there is a large DC voltage from drain to source or a large AC voltage from drain to source, as in the case of an RF switch under high power and voltage conditions. Examples of such resistor limitation boundaries are the IR (i.e. voltage) drop across body resistor network filters due to body current when approaching the compression point or RF transistor soft breakdown, and the RC time constant for meeting switching time specifications.

SUMMARY

The present disclosure reduces and improves on the abovementioned problems by providing circuits and methods to bypass or introduce resistance in the bias feed network for given steady states of the RF switch, or transitions to those states.

According to a first aspect, a FET switch stack is provided, comprising: a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa; a gate resistor network comprising resistors connected to gate terminals of the FET switches and one or more common gate resistors connected to the gate resistor network, the gate resistor network and the one or more common gate resistors configured to feed a gate control voltage (Vgate) to the gate terminals of the FET switches; a body resistor network comprising resistors connected to body terminals of the FET switches and one or more common body resistors connected to the body resistor network, the body resistor network and the one or more common body resistors configured to feed a body control voltage (Vbody) to the body terminals of the FET switches; and a stacked arrangement of body bypass FET switches, each body bypass FET switch connected across a respective common body resistor (320) of the one or more common body resistors and configured to i) bypass the respective common body resistor during at least a portion of the OFF steady state of the FET switch stack and ii) not to bypass the respective common body resistor during at least a portion of the ON steady state.

According to a second aspect, a method of operating a FET switch stack comprising i) a stacked arrangement of FET switches connected at one end to an RF terminal configured to be coupled to an RF signal, ii) a gate resistor network connected to gate terminals of the FET switches, iii) a body resistor network connected to body terminals of the FET switches, iv) at least one common gate resistor connected to the gate resistor network and v) at least one common body resistor connected to the body resistor network is provided, the method comprising: during at least a portion of a first steady state of the FET switch stack where the FET switches are ON, biasing the gate resistor network and the body resistor network without bypassing the at least one common gate resistor and the at least one common body resistor; during at least a portion of a first transition state of the FET switch stack where the FET switches transition from ON to OFF, biasing the gate resistor network and the body resistor network by bypassing the at least one common gate resistor and without bypassing the at least one common body resistor; during at least a portion of a second steady state of the FET switch stack where the FET switches are OFF, biasing the gate resistor network and the body resistor network without bypassing the at least one common gate resistor and by bypassing the at least one common body resistor; and during at least a portion of a second transition state of the FET switch stack where the FET switches transition from OFF to ON, biasing the gate resistor network and the body resistor network by bypassing the at least one common gate resistor and without bypassing the at least one common body resistor.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
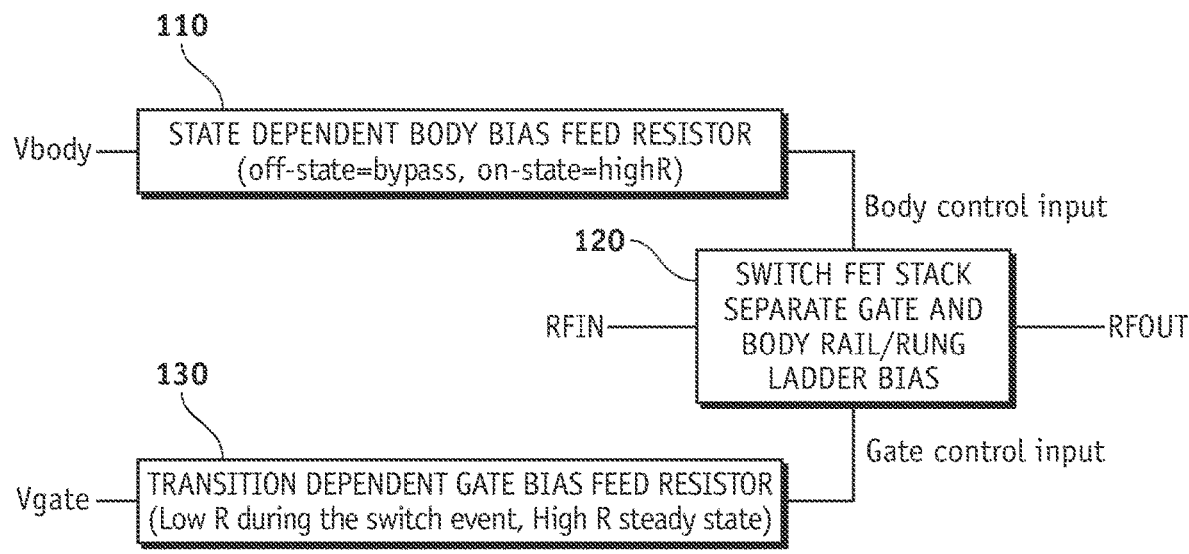
FIG. 1 shows a schematic representation of a transition-dependent gate resistor bypass and a state-dependent body resistor bypass according to the teachings of the present disclosure.

FIG. 1 shows a schematic representation of the teachings according to the present disclosure, where an RF switch FET stack (schematically indicated with 120) with input RFIN and output RFOUT is shown. FET stack (120) is biased through resistor networks, such as body and gate rail/rung resistor ladders. FET stack (120) also includes a gate control block (130) to control the bias on the gate terminals of the FETs of the FET stack and a body control block (110) to control the bias on the body terminals of the FETs of the FET stack.

According to an embodiment of the disclosure, control of the bias on the body terminals occurs through a main RF switch state-dependent body bias feed resistor or set of resistors (110) between the body bias voltage (Vbody) and the body resistor ladder of the RF switch. The body bias feed resistor has a high resistance value when compared to the resistance values of the body resistor ladder (e.g. hundreds of k-ohms when compared to tens of k-ohms). Body control block (110) includes state-dependent resistors. In particular, when the RF switch is in the ON state, the body bias voltage is provided to the body resistor ladder though the body bias feed resistor (high R) resulting in a high Q condition and improved insertion loss and bandwidth. On the other hand, when the RF switch is in the OFF state, and high body currents can flow during large RF switch FET stack voltage swings, the body bias feed resistor is bypassed and has a negligible influence (low R) on the body bias voltage provided to the body resistor ladder.

According to a further embodiment of the disclosure, the body bias control through a state-dependent body bias feed resistor or set of resistors (110) operates together with a transition-dependent gate bias feed resistor or set of resistors (130) between the gate bias voltage (Vgate) and the rail/rung gate resistor ladder. The gate bias feed resistor has a high resistance value when compared to the resistance values of the gate resistor ladder. Gate control block (130) includes transition-dependent resistors. In particular, when the RF switch is in a steady state (ON or OFF), the gate bias voltage is provided to the gate resistor ladder through the gate bias feed resistor (high R). On the other hand, when the RF switch transitions from the ON state to the OFF state or vice versa, the gate bias feed resistor is bypassed and has a negligible influence (low R) on the gate bias voltage provided to the gate resistor ladder.

With continued reference to this further embodiment, while transition-dependent gate bias resistors are known as such (see, e.g., U.S. Pat. No. 10,396,772 issued on Aug. 27, 2019, owned by applicant and incorporated herein by reference in its entirety), the teachings of this further embodiment advantageously combine such transition-dependent gate bias with a state dependent body bias.

For example, in case of the RF switch switching from ON to OFF, a steady ON state (first state) can be followed by an ON-to-OFF transition state (second state) and then by a steady OFF state (third state). In the first state the gate bias resistor and the body bias resistor are not bypassed. In the second state the gate bias resistor is bypassed while the body bias resistor is not bypassed. In the third state, the gate bias resistor is not bypassed while the body bias resistor is bypassed. Similarly, in case of the RF switch switching from OFF to ON, an initial steady OFF state (first state) can be followed by an OFF-to-ON transition state (second state) and then followed by a steady ON state (third state). In the first state the gate bias resistor is not bypassed while the body bias resistor is bypassed. In the second state the gate bias resistor is bypassed while the body bias resistor is not bypassed. In the third state the gate bias resistor and the body bias resistor are not bypassed. While this description includes timing periods and boundaries, the person skilled in the art will recognize that some of the above described actions may occur during a portion of the time period. By way of example, when the gate bias resistor is bypassed in the second state, it may not necessarily occur during the entire duration of the second state, but rather a portion of it.

Figure 2:
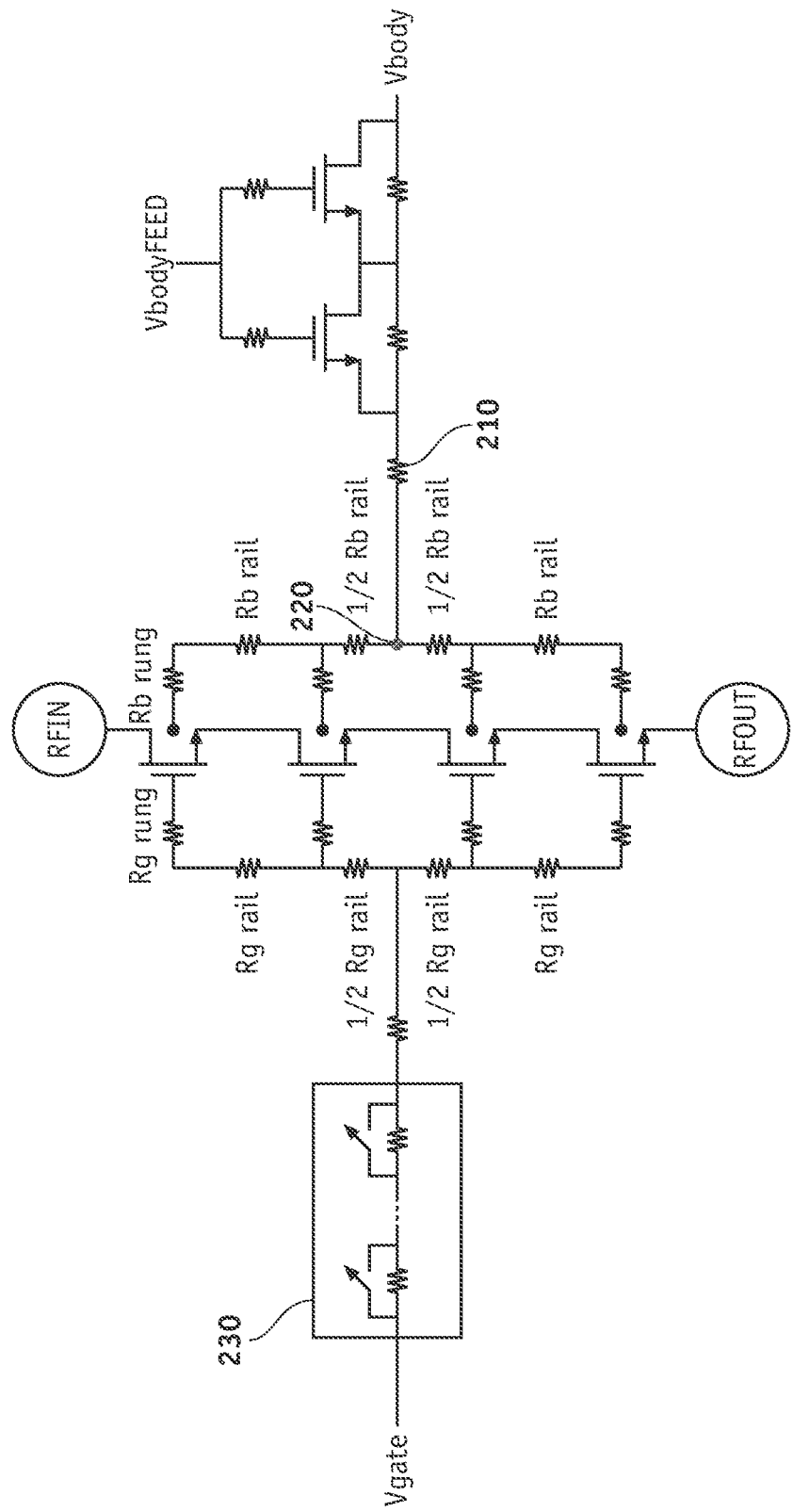
FIG. 2 shows a more detailed schematic exemplifying the teachings of FIG. 1.

FIG. 2 shows a more detailed example of the embodiments described above. Incidentally, while FIG. 2 shows a series RF switch (RF input signal RFIN input to the RF switch and output as RFOUT), the person skilled in the art will understand that the same or similar teachings are also applicable to a shunt RF switch (where the switch is between an RF input signal and a reference voltage such as ground).

In the example of FIG. 2, the state-dependent body bias feed resistor is represented as a series combination of two (or more) resistors (usually each having a resistance value in the tens of k-ohms) each of them across a respective nMOS transistor, the ON/OFF state of which is controllable by a gate voltage VbodyFEED. By setting the nMOS transistors ON (VbodyFEED sufficiently higher than Vbody in the example of the figure), the body bias feed resistors are bypassed.

With continued reference to the diagram of FIG. 2, by way of example, it can be assumed that both Vbody and VbodyFEED can each be switched between a "high" value (e.g. 0 V) and a "low" value (e.g. −3.4 V). In order to bypass the high resistance feed resistors (when compared to the values of the body ladder resistors) across the nMOS transistors during the OFF state of the main RF switch, VbodyFEED is set at 0V while Vbody is set at −3.4V, thus feeding the body ladder through the series combination of the gate resistor and the on-resistance Ron of the nMOS transistors and effectively eliminating the effect of the high resistance feed resistors. On the other hand, during the ON state of the main RF switch, VbodyFEED is for example set at −3.4V while Vbody is set at 0V, thus effectively eliminating the effect of the nMOS transistors on the high resistance feed resistors and allowing the body ladder to be fed through such resistors. The value in this approach is also extended to device reliability whereby the high voltage body resistor bypass method operates within a 0 to −3.4V (as an example) biasing regime in both "states." This ensures reliability and also allows the required control voltage to comfortably pass to the core RF FET stack. In addition, in both the ON and OFF states of the RF FET switch stack core, there is a high AC voltage riding on the gate and body control lines. When the state dependent body bypass network (see e.g. (110) in FIG. 1) is in non-bypass mode (ON state of RF core), the transistors in the circuit have to withstand the full RF voltage. The stacked control bypass network according to the present disclosure allows for safe and reliable operation under that condition.

FIG. 2 also shows a body feed resistor (210) that is not bypassed during the OFF state of the main switch (also called RF core as in the above paragraph), to prevent or isolate the presence of an AC ground at the body feed node (220). The value of resistor (210) is usually in k-ohms (e.g. 20 k-ohms), but other values can be envisaged by the person skilled in the art, depending on the implementation.

While FIG. 2 shows a stack of two nMOS bypassing switches, the person skilled in the art will understand that less (i.e. one) or more (e.g. three) bypassing switches can be provided, with corresponding changes in the voltage capabilities of such devices and the resistance values of the resistors to be bypassed during the steady OFF state of the main RF switch. Additionally, the bypassing switches can also embody pMOS transistors or other kind of transistors, with corresponding changes to the voltage biasing of such devices. Due to the nature of a stacked configuration, only smaller portions of the RF swing between Vbody and the body bias resistor ladder will appear across each of the stacked bypass FET switches and this will reduce the risk of breakdown. Moreover, the bypassing switches can be configured to be sized for a gate width such that their resulting on-resistance Ron is small relative to the high resistance feed resistors. This means the bypassing switches can have a higher resistance than the RF switching FETs of the main RF switch, and thus smaller size.

The open configuration of the body feed stack in the ON state (i.e. body circuit series resistors not bypassed) of the main RF switch results in more resistance and a better insertion loss, thus a better Q. On the other hand, in the OFF state of the main RF switch, the reduced total resistance due to the presence of the bypassing switches results in a smaller drop across the net body resistance due to the body currents and thus reduces the body voltage de-biasing effect. Additionally, the bypassing stack is cost- and space-effective for at least two reasons. Given the about 3V swing between the high and low states discussed above, the stack length can be equal to the stack height of the main RF switch. However, embodiments can also be provided where the stack length is lower than the stack height of the main RF switch. Moreover, given the resistance values to be bypassed (e.g. tens of k-ohms each), the impedance of the bypassing transistors does not need to be too low.

Turning now to the gate side of FIG. 2, a gate bias feed arrangement comprising a resistor bypass configuration is schematically shown as (230). An exemplary implementation of such transition dependent gate bias feed resistor can be taken from FIG. 4A of U.S. Pat. No. 10,396,772, incorporated herein by reference, the detailed explanation of which will be omitted in the present disclosure.

The person skilled in the art will understand that the representation of FIG. 2 is for schematic purposes only and that details that are not specifically discussed in the present application are missing. By way of example, resistors across the drain and source of each FET of the main RF switch stack are not shown, for the sake of better clarity. Additionally, the bias gate and body resistor networks can be arranged in a variety of different ways, not just as rail/rung ladders as exemplarily shown in FIG. 2.

Figure 3:
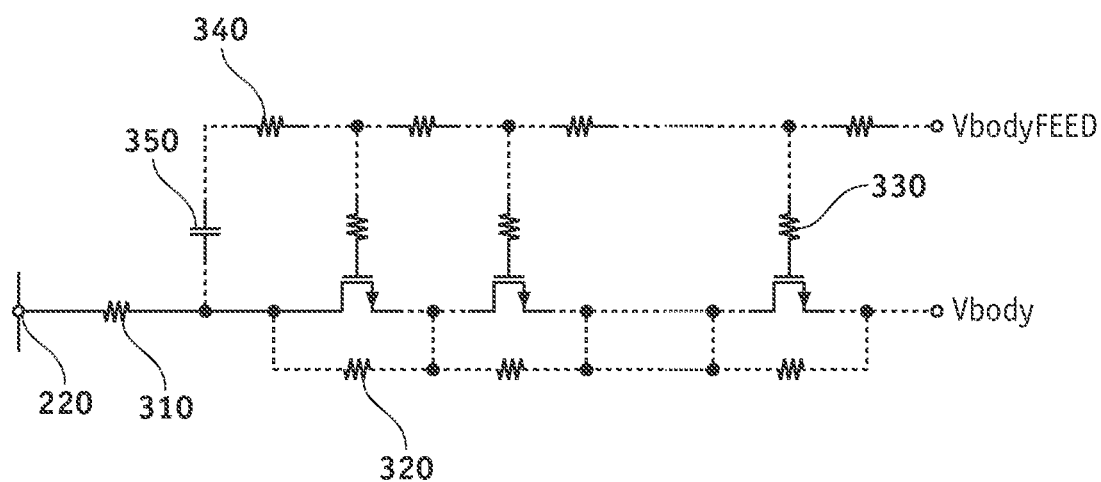
FIG. 3 shows an embodiment of the body resistor bypass shown in FIG. 2.

Reference will now be made to FIG. 3 which shows an embodiment of the state-dependent body bias feed resistor arrangement discussed in the previous figures. In the embodiment of FIG. 3 a stacked arrangement of nMOS bypass switches across respective bypassable resistors (320) is shown, together with gate resistors (330), rail resistors (340) and an AC bias capacitor (350) across the leftmost bypass switch in the stack.

The person skilled in the art will understand that stacks having a large number of nMOS switches are preferred in order to allow the switches to withstand the full voltage swing of the RF signal during the ON condition of the main RF switch. While the number of nMOS switches in the stack will depend on the type and voltage capabilities of each component nMOS switch, a typical number of nMOS switches in the stack would be a number equal to the number of switches in the main stack (e.g. 24) or more. A higher number of nMOS switches will also allow a large body feed resistance value to be partitioned in a series arrangement of several resistors, one across each nMOS transistor, each having a smaller resistance value. By way of example, a main RF switch stack of 24 main RF switches, could have a body feed bypass arrangement with 24 nMOS switches, each across a resistor (320) of 22 k-ohm, in series with a non-bypassed resistor (310) of 20 k-ohm, thus providing an overall resistance on the common body feed of about 20 k-ohm in the OFF state of the main switch and an overall resistance of about 20 k-ohm+(24×22 k-ohm)=about 548 k-ohm in the ON state of the main switch.

As already noted above, the embodiment of FIG. 3 shows a body feed arrangement where rail resistors (340, shown horizontally on the VbodyFEED line) are provided. The presence of such rail resistors provides for a higher quality factor Q and better voltage division.

The embodiment of FIG. 3 also shows an AC bias, DC blocking, capacitor (350) across the leftmost bypass switch in the stack, to improve voltage division across the body bypass stack. AC bias capacitors are discussed in detail, for example, in U.S. Pat. No. 10,236,872 issued on Mar. 19, 2019, owned by applicant and incorporated herein by reference in its entirety.

The voltages Vgate, Vbody and VbodyFEED of the RF switch according to the present disclosure are controlled by a control arrangement which will be now discussed in detail.

By way of example, a Vgate control signal can switch between a high voltage level of +3.4V (to turn the main RF switch ON) and a low voltage level of −3.4V (to turn the main RF switch OFF), a Vbody control signal can switch between a high voltage level of 0V (when the main RF switch is ON) and a low voltage level of −3.4V (when the main RF switch is OFF), and a VbodyFEED control signal can switch between a high voltage level of 0V (to turn the bypass ON) and a low voltage level of −3.4V (to turn the bypass OFF).

In view of the above exemplary values, the difference between the voltage at the gate terminal and the voltage at the body terminal of each transistor of the main RF switch will be 3.4V during the steady ON state of the main RF switch and 0V during the steady OFF state of the main RF switch. Care should be taken that a situation where such difference reaches higher values (e.g. up to about the full transition swing of 6.8V) during the transition period is avoided in order not to damage the switches. In view of this, the control arrangement according to the present disclosure appropriately times the Vgate, Vbody and VbodyFEED control signals, e.g. through the introduction of delay blocks, in order to improve safety and reliability of the main RF switch.

In particular, when the main RF switch is to be turned ON, transition of the Vgate control signal from low to high is delayed in order to start only when the voltage on the body of each RF switch has already settled from low to high. Additionally, in order to allow a fast transition of such body voltage from low to high, the bypass is kept ON (VbodyFEED control signal high) during such transition, in order to minimize the influence of the bypassed resistance (which can have a high value such as 500 k-ohm, as noted above) on the path to the body of each RF switch. This VbodyFEED delay allows the RF switch FET stack body to complete its transition to the final body ON state before the high impedance is presented to the body node.

On the other hand, when the main RF switch is to be turned OFF, transition of the Vbody control signal from high to low is delayed in order to start only when the voltage on the gate of each RF switch has already settled from high to low. Additionally, the bypass is kept OFF (VbodyFEED control signal low) until the voltage on the gate of each RF switch settles to low, and then turned ON.

Figure 4:
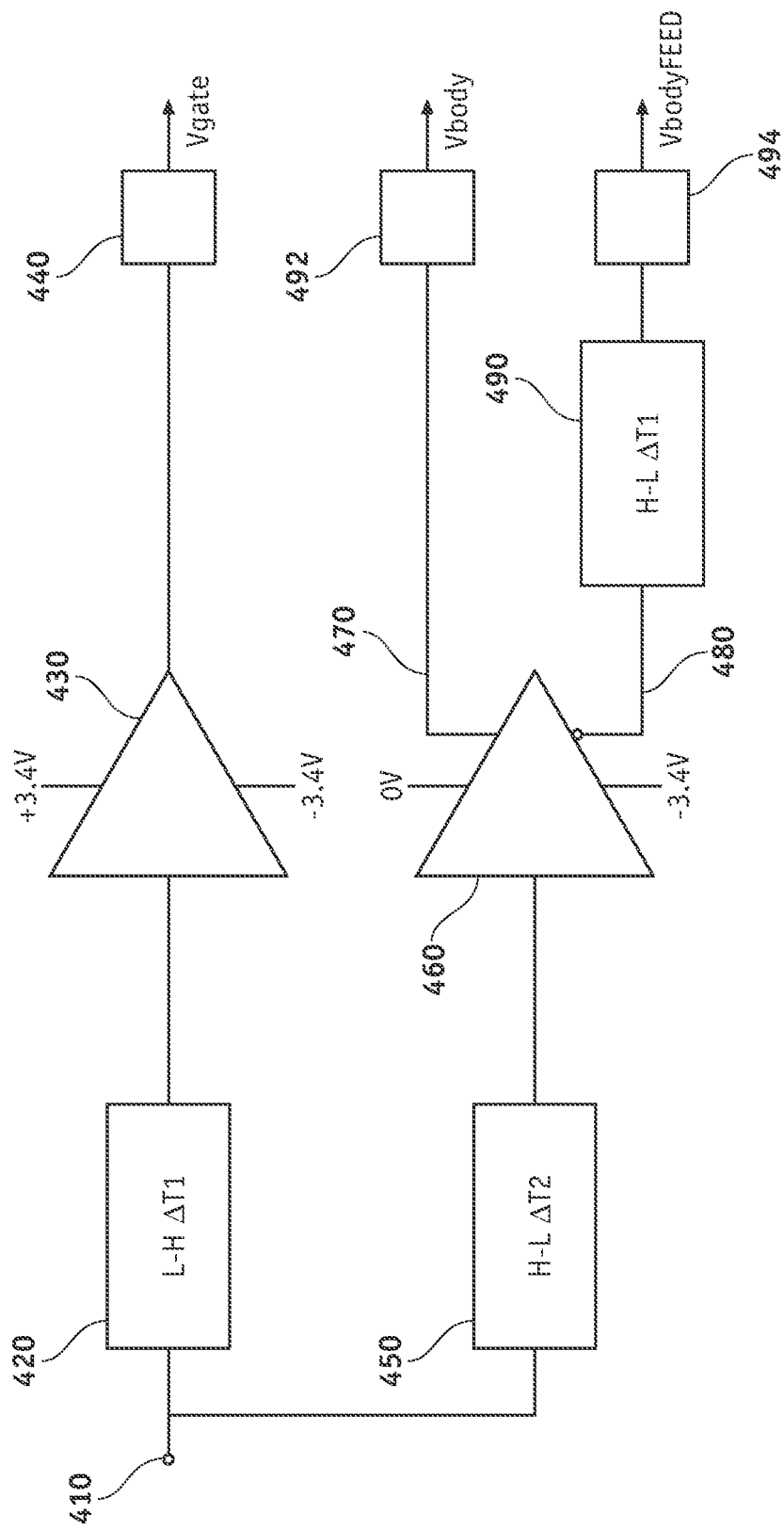
FIG. 4 shows a schematic implementation of a control circuit for use with FIGS. 1-3.

An exemplary circuital arrangement for the Vgate, Vbody and VbodyFEED control signals, employing delay blocks that take the above considerations into account, is shown in FIG. 4, where a digital high/low input (410) is processed in order to control the abovementioned voltages.

On the Vgate control path, a low-to-high transition delay ΔT1 (420) is provided, together with a gate driver (430) (e.g. a combination of a buffer and level shifter) to provide the desired exemplary +3.4V and −3.4V voltage levels for the Vgate control signal, together with a filter (440) (e.g. a capacitor).

On the Vbody and VbodyFEED control paths, a high-to-low transition delay ΔT2 (450) is provided (where ΔT2 can be equal to or different from ΔT1), together with a body driver (460) to provide the desired exemplary −3.4V and 0V voltage levels for the Vbody and VbodyFEED control signals. Here, the body driver (460) is provided with an in-phase output (470) for the Vbody control signal path and an inverted output (480) for the VbodyFEED control signal path. A further high-to-low transition delay ΔT1 (490) is provided on the VbodyFEED control signal path, together with filters (492, 494) on each path. State-dependent delay circuits are described, for example, in U.S. Pat. No. 9,184,731, incorporated herein by reference in its entirety.

By comparing the embodiment of FIG. 4 with the above noted timing considerations when the main RF switch is to be turned ON or OFF, the person skilled in the art will understand that low-to-high transition delay (420) on the Vgate control signal path allows Vgate to go high only when the voltage on the body of the RF switches has already settled from low to high. Similarly, high-to-low transition delay (450) on both Vbody and VbodyFEED control signal paths allows the Vbody control signal to go low on the in-phase path, and the VbodyFEED control signal to correspondingly go high on the inverted path, only when the voltage on the gate of the RF switches has already settled from high to low. Additionally, high-to-low transition delay (490) allows the VbodyFEED control signal to go low on the inverted path only when the voltage on the body of the RF switches has already transitioned from low to high.

Figure 5:
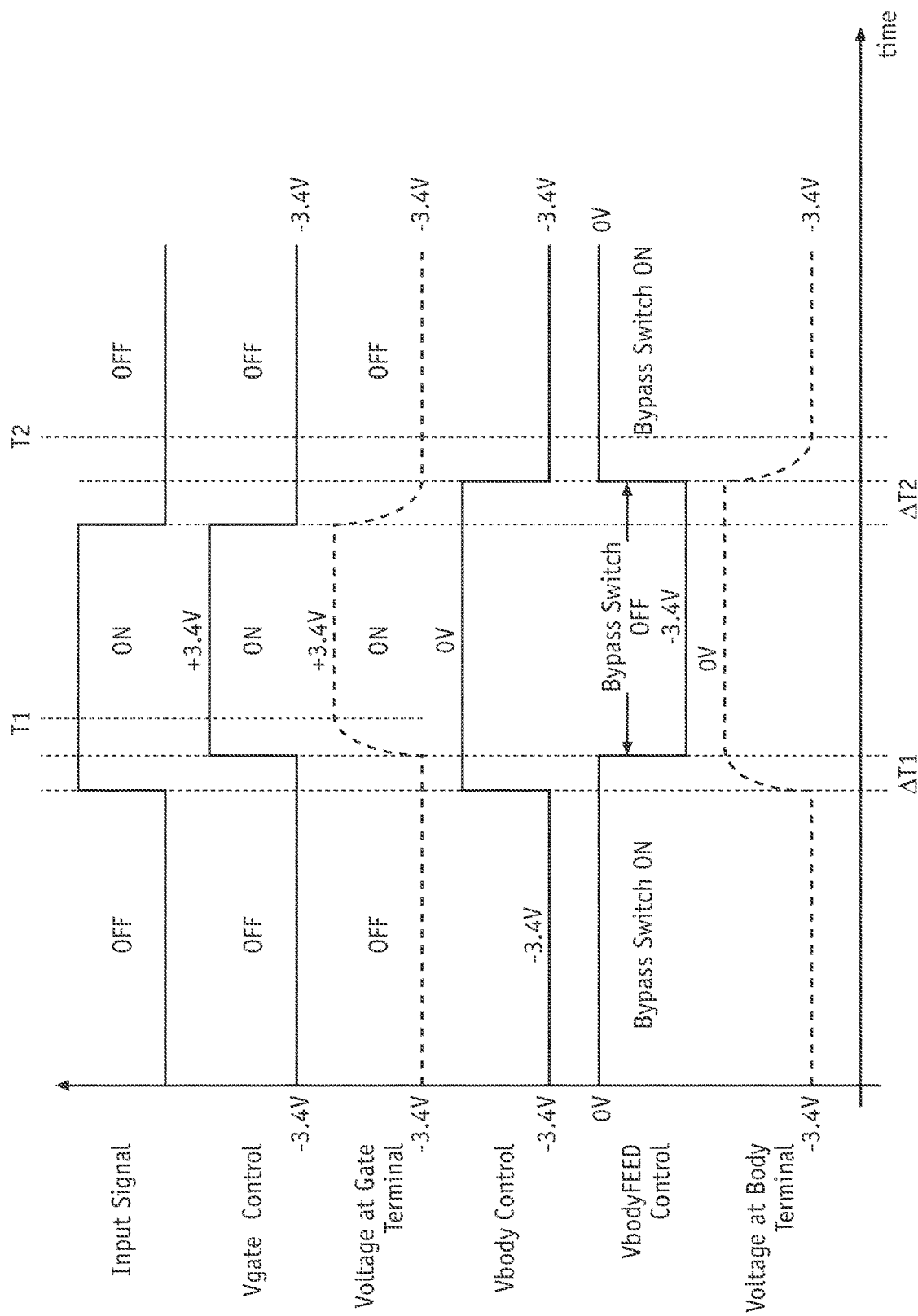
FIG. 5 shows a timing diagram for the control circuit of FIG. 4. Like reference numbers and designations in the various drawings indicate like elements.

FIG. 5 shows a timing diagram where the above teachings are shown in detail. The first time-varying graph from top to bottom shows the input signal (410) of FIG. 4, which goes from a logic 0 to a logic 1 and vice versa. The second graph shows the Vgate control signal at the output of the Vgate path of FIG. 4. The third graph shows the voltage at the gate terminal of each RF switch, where steady ON and OFF states and transient ON-OFF and OFF-ON states are shown. The fourth graph shows the Vbody control signal at the output of the Vbody path of FIG. 4. The fifth graph shows the VbodyFEED control signal at the output of the VbodyFEED path of FIG. 4. The sixth graph shows the voltage at the body terminal of each RF switch, where steady ON and OFF states and transient ON-OFF and OFF-ON states are shown.

Comparing FIG. 5 with FIG. 4, the ΔT1 on the bottom left of FIG. 5 represents the delay introduced by block (420) of FIG. 4 for the Vgate control signal and the delay introduced by block (490) of FIG. 4 for the VbodyFEED control signal. On the other hand, the ΔT2 on the bottom right of FIG. 5 represents the delay introduced by block (450) of FIG. 4 for the Vbody control signal and the VbodyFEED control signal. As already noted above, such two delays can be the same or different.

The timing diagram of FIG. 5 also shows time instants T1 and T2. T1 refers to the ON steady state of the main RF switch and represents the moment where both the gate voltage and the body voltage of the RF switches have settled to respective high values. On the other hand, T2 refers to the OFF steady state of the main RF switch and represents the moment where both the gate voltage and the body voltage of the RF switches have settled to respective low values. T1 and T2 represent the moment when high power can be safely applied throughout the main RF switch in respective ON and OFF states of the RF switch, given that stability at both gate and body terminals has been reached.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A FET switch stack comprising:
    a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa;
    a gate resistor network comprising resistors connected to gate terminals of the FET switches;
    common gate resistors connected to the gate resistor network, the gate resistor network and the common gate resistors configured to feed a gate control voltage to the gate terminals of the FET switches;
    a body resistor network comprising resistors connected to body terminals of the FET switches;
    common body resistors connected to the body resistor network, the body resistor network and the common body resistors configured to feed a body control voltage to the body terminals of the FET switches;
    a stacked arrangement of gate bypass FET switches, each gate bypass FET switch connected across a respective common gate resistor of the common gate resistors and configured to i) bypass the respective common gate resistor during at least a portion of the transition state of the FET switch stack and ii) not to bypass the respective common gate resistor during at least a portion of states of the FET switch stack different from the transition state; and
    a stacked arrangement of body bypass FET switches, each body bypass FET switch connected across a respective common body resistor of the common body resistors and configured to i) bypass the respective common body resistor during at least a portion of the OFF steady state of the FET switch stack and ii) not to bypass the respective common body resistor during at least a portion of the ON steady state.

2. The FET switch stack of claim 1, connected at another end to another RF terminal configured to output the RF signal.

3. The FET switch stack of claim 1, connected at another end to a reference voltage.

4. The FET switch stack of claim 3, wherein the reference voltage is ground.

5. The FET switch stack of claim 1, wherein the stacked arrangement of body bypass FET switches comprises a number of body bypass FET switches inferior to a number of the common body resistors.

6. The FET switch stack of claim 5, wherein the number of body bypass FET switches is equal to the number of the common body resistors minus one.

7. The FET switch stack of claim 5, wherein the number of body bypass FET switches is equal to or higher than a number of FET switches in the stacked arrangement of FET switches.

8. The FET switch stack of claim 1, wherein the body bypass FET switches are nMOS FET switches.

9. The FET switch of claim 1, further comprising
    a bypass resistor network comprising resistors connected to the body bypass FET switches, the bypass resistor network configured to feed a bypass control voltage to the body bypass FET switches.

10. The FET switch stack of claim 9, wherein the bypass resistor network comprises body bypass gate resistors connected to respective gates of the body bypass FET switches.

11. The FET switch stack of claim 10, wherein the bypass resistor network further comprises body bypass rail resistors connected between the body bypass gate resistors.

12. The FET switch stack of claim 11, further comprising a capacitor connected between a drain and a gate of a body bypass FET switch closest to a node connecting the stacked arrangement of body bypass FET switches to the body resistor network.

13. The FET switch stack of claim 9, wherein
    the ON or OFF steady state where the FET switches are respectively ON or OFF comprises a gate terminal ON or OFF steady state and a body terminal ON or OFF steady state;
    the transition state where the FET switches transition from ON to OFF or vice versa comprises a gate terminal transition state and a body terminal transition state;
    the gate control voltage and the body control voltage are configured to switch between respective first gate and body control values to set the FET switches ON and respective second gate and body control values to set the FET switches OFF and vice versa; and
    the bypass control voltage is configured to switch between a first bypass control value to set the body bypass FET switches ON to bypass the common body resistors and a second bypass control value to set the body bypass FET switches OFF to not bypass the common body resistors and vice versa.

14. The FET switch stack of claim 13, wherein
    switching of the gate control voltage from the second gate control value to the first control value and switching of the bypass control voltage from the first bypass control value to the second bypass control value is configured to occur upon completion of the body terminal transition state when the body terminal settles to the ON steady state.

15. The FET switch stack of claim 14, wherein switching of the body control voltage from the first body control value to the second body control value and switching of the bypass control voltage from the second bypass control value to the first bypass control value is configured to occur upon completion of the gate terminal transition state when the gate terminal settles to the OFF steady state.

16. A switching arrangement comprising the FET switch stack of claim 15 and control circuitry, the control circuitry comprising:
 a first delay block to delay the switching of the gate control voltage from the second gate control value to the first control value;
 a second delay block to delay the switching of the body control voltage from the first body control value to the second body control value and the switching of the bypass control voltage from the second bypass control value to the first bypass control value; and
 a third delay block to delay the switching of the bypass control voltage from the first bypass control value to the second bypass control value.

* * * * *